(12) United States Patent
Wang et al.

(10) Patent No.: US 11,496,697 B2
(45) Date of Patent: Nov. 8, 2022

(54) LWIR SENSOR WITH CAPACITIVE MICROBOLOMETER AND HYBRID VISIBLE/LWIR SENSOR

(71) Applicant: Samsung Electronics Co., Ltd., Suwon-si (KR)

(72) Inventors: Yibing Michelle Wang, Temple City, CA (US); Kwang Oh Kim, Cerritos, CA (US); Radwanul Hasan Siddique, Pasadena, CA (US)

(73) Assignee: SAMSUNG ELECTRONICS CO., LTD.

( * ) Notice: Subject to any disclaimer, the term of this patent is extended or adjusted under 35 U.S.C. 154(b) by 0 days.

(21) Appl. No.: 16/868,527

(22) Filed: May 6, 2020

(65) Prior Publication Data

US 2021/0274107 A1    Sep. 2, 2021

Related U.S. Application Data

(60) Provisional application No. 62/982,859, filed on Feb. 28, 2020.

(51) Int. Cl.
*H04N 5/33* (2006.01)
*H04L 27/14* (2006.01)
*H01L 27/146* (2006.01)

(52) U.S. Cl.
CPC ......... *H04N 5/33* (2013.01); *H01L 27/14645* (2013.01); *H01L 27/14649* (2013.01)

(58) Field of Classification Search
None
See application file for complete search history.

(56) References Cited

U.S. PATENT DOCUMENTS

| | | | | |
|---|---|---|---|---|
| 4,142,207 A | * | 2/1979 | McCormack | H01L 37/02 250/338.2 |
| 4,348,611 A | * | 9/1982 | Ruppel | G01J 5/34 365/65 |
| 4,686,373 A | * | 8/1987 | Tew | H04N 5/33 257/E29.096 |
| 5,288,649 A | * | 2/1994 | Keenan | H01L 27/1467 348/E3.018 |
| 5,808,350 A | | 9/1998 | Jack et al. | |

(Continued)

FOREIGN PATENT DOCUMENTS

WO    2019204515 A1    10/2019

*Primary Examiner* — Reza Aghevli
(74) *Attorney, Agent, or Firm* — Renaissance IP Law Group LLP

(57) ABSTRACT

A pixel for an image sensor includes a microbolometer sensor portion, a visible image sensor portion and an output path. The microbolometer sensor portion outputs a signal corresponding to an infrared (IR) image sensed by the microbolometer sensor portion. The visible image sensor portion outputs a signal corresponding to a visible image sensed by the visible image sensor portion. The output path is shared by the microbolometer and the visible image sensor portions, and is controlled to selectively output the signal corresponding to the IR image or the signal corresponding to the visible image. The output path may be further shared with a visible image sensor portion of an additional pixel, in which case the output path may be controlled to selectively to also output the signal corresponding to a visible image of the additional pixel.

14 Claims, 12 Drawing Sheets

(56) References Cited

U.S. PATENT DOCUMENTS

| | | | |
|---|---|---|---|
| 7,459,686 B2 | 12/2008 | Syllaios et al. | |
| 7,491,937 B2 | 2/2009 | Nakanishi et al. | |
| 7,679,048 B1 * | 3/2010 | Aziz | H01L 27/14669 |
| | | | 250/252.1 |
| 8,552,375 B1 * | 10/2013 | Aziz | H04N 5/33 |
| | | | 327/554 |
| 2004/0200961 A1 * | 10/2004 | Parrish | G01J 5/02 |
| | | | 348/E5.081 |
| 2007/0170359 A1 * | 7/2007 | Syllaios | H04N 5/332 |
| | | | 348/E5.09 |
| 2007/0272864 A1 * | 11/2007 | Li | G01J 5/40 |
| | | | 438/58 |
| 2009/0050806 A1 * | 2/2009 | Schmidt | H04N 5/232945 |
| | | | 250/332 |
| 2014/0112537 A1 * | 4/2014 | Frank | G01N 21/17 |
| | | | 315/149 |
| 2014/0226021 A1 * | 8/2014 | Koechlin | H04N 5/33 |
| | | | 250/338.3 |
| 2015/0085134 A1 * | 3/2015 | Novotny | H04N 5/3535 |
| | | | 348/164 |
| 2015/0379361 A1 * | 12/2015 | Boulanger | H04N 5/2257 |
| | | | 701/2 |
| 2016/0065848 A1 * | 3/2016 | LeBeau | G01J 5/0804 |
| | | | 348/135 |
| 2017/0328776 A1 * | 11/2017 | Shimasaki | H01L 27/307 |
| 2017/0374261 A1 * | 12/2017 | Teich | H04N 17/002 |
| 2018/0059014 A1 * | 3/2018 | Ruback | H04N 5/23293 |
| 2019/0158769 A1 * | 5/2019 | Walsh | H04N 5/378 |
| 2020/0202569 A1 * | 6/2020 | Sandsten | H04N 5/365 |
| 2021/0003454 A1 * | 1/2021 | Ruther | G01J 5/0896 |

* cited by examiner

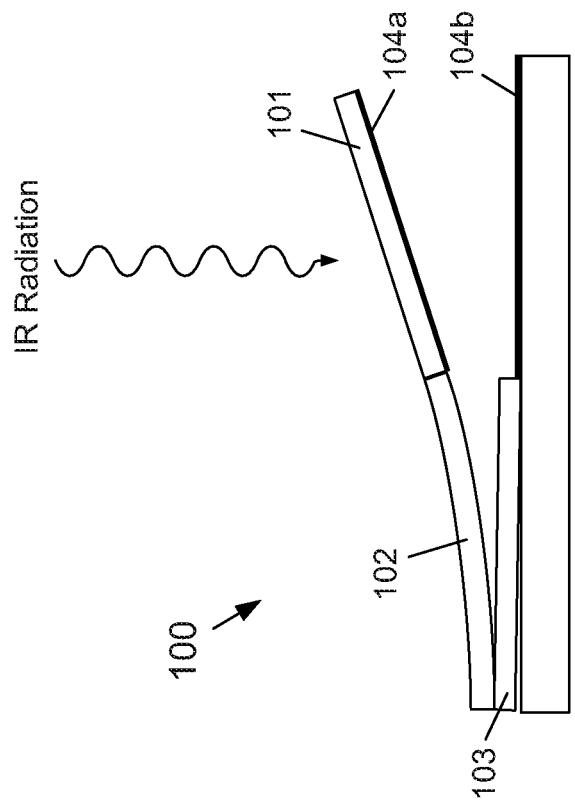
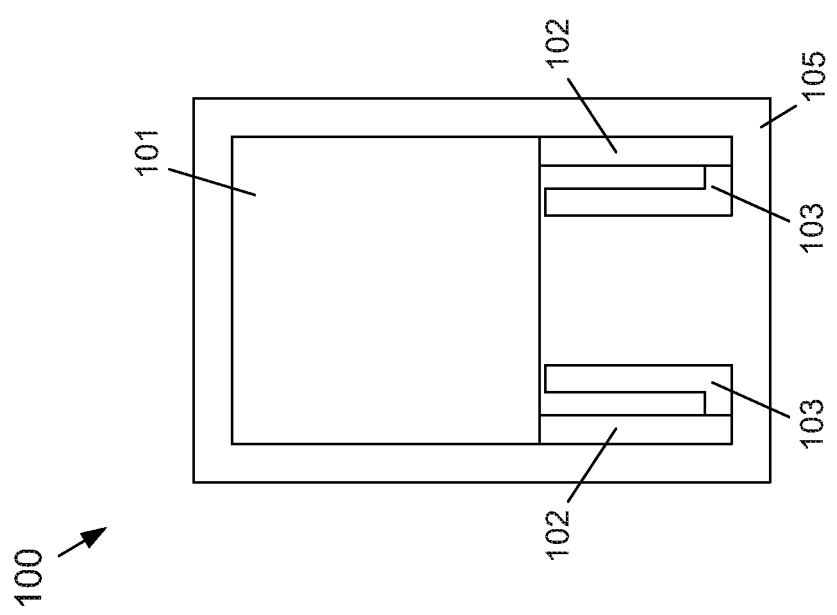
FIG. 1B
FIG. 1A

FIG. 4E
FIG. 4H
FIG. 4D
FIG. 4G
FIG. 4C
FIG. 4F

LWIR SENSOR WITH CAPACITIVE MICROBOLOMETER AND HYBRID VISIBLE/LWIR SENSOR

CROSS-REFERENCE TO RELATED APPLICATION

This application claims the priority benefit under 35 U.S.C. § 119(e) of U.S. Provisional Application No. 62/982,859, filed on Feb. 28, 2020, the disclosure of which is incorporated herein by reference in its entirety.

TECHNICAL FIELD

The subject matter disclosed herein relates to image sensors. More specifically, the subject matter disclosed herein relates to an image sensor that may include a long-wavelength infrared (LWIR) image sensor pixel and to an image sensor that may include a hybrid pixel that combines an LWIR sensor and a complementary metal-oxide semiconductor (CMOS) image sensor (CIS) into a single pixel.

BACKGROUND

Low-cost thermal Long Wavelength Infrared (LWIR) sensors may be highly desired for advanced driver-assist systems (ADAS) and autonomous driving applications because active illumination is not needed and can see human objects that are blocked by obstacles. Most thermal cameras include resistive bolometers that use a DC bias current for readout that may cause self-heating of the bolometer, and the readout circuit for a resistive bolometer may be complicated.

Combining a visible-imaging capability and a thermal-imaging capability into one sensor may significantly reduce system cost, enable improved night vision, improve object-recognition accuracy, and lower processing power. Nevertheless, it is difficult to integrate a resistive bolometer with a visible CIS.

SUMMARY

An example embodiment provides a pixel for an image sensor that may include a microbolometer sensor portion, a visible image sensor portion and an output path. The microbolometer sensor portion may output a signal corresponding to an IR image sensed by the microbolometer sensor portion. The visible image sensor portion may output a signal corresponding to a visible image sensed by the visible image sensor portion. The output path may be shared by the microbolometer sensor portion and the visible image sensor portion. The output path may be controlled to selectively output the signal corresponding to the IR image or the signal corresponding to the visible image. In one embodiment, the pixel may be part of an array of pixels.

An example embodiment provides an image sensor that may include an array of pixels. At least one first pixel may include a microbolometer sensor portion and a visible image sensor portion. The microbolometer sensor portion may output a signal corresponding to an IR image sensed by the microbolometer sensor portion, and the visible image sensor portion may outputs a signal corresponding to a visible image sensed by the visible image sensor portion of the first pixel. At least one second pixel may include a visible image sensor portion that may output a visible image sensed by the visible image sensor portion of the second pixel. An output path may be shared by the microbolometer sensor portion, the visible image sensor portion of the first pixel, and the visible image portion of the second pixel, the output path and may be controlled to selectively output the signal corresponding to the IR image, the signal corresponding to the visible image sensed by the visible image portion of the first pixel, or the signal corresponding to the visible image sensed by the visible image portion of the second pixel.

An example embodiment provides a pixel for an image sensor that may include a microbolometer sensor portion, a visible image sensor portion and an output path. The microbolometer sensor portion may be a capacitive microbolometer sensor that may output a signal corresponding to an IR image sensed by the microbolometer sensor portion. The visible image sensor portion may include a photodiode that may output a signal corresponding to a visible image sensed by the visible image sensor portion, the visible image sensor portion comprising a photodiode. The output path may be shared by the microbolometer sensor portion and the visible image sensor portion. The output path may be controlled to selectively output the signal corresponding to the IR image or the signal corresponding to the visible image.

BRIEF DESCRIPTION OF THE DRAWING

In the following section, the aspects of the subject matter disclosed herein will be described with reference to exemplary embodiments illustrated in the figure, in which:

FIGS. 1A and 1B respectively depict example top and side views of a capacitive microbolometer that may be used in the example embodiments of a pixel for an image sensor according to the subject matter disclosed herein;

FIGS. 4A-4J respectively depict example embodiments of arrays of different physical arrangements or placements of hybrid pixels or of visible pixels (R,G,B) and microbolometer pixels (IR) according to the subject matter disclosed herein;

DETAILED DESCRIPTION

Figure 1C:
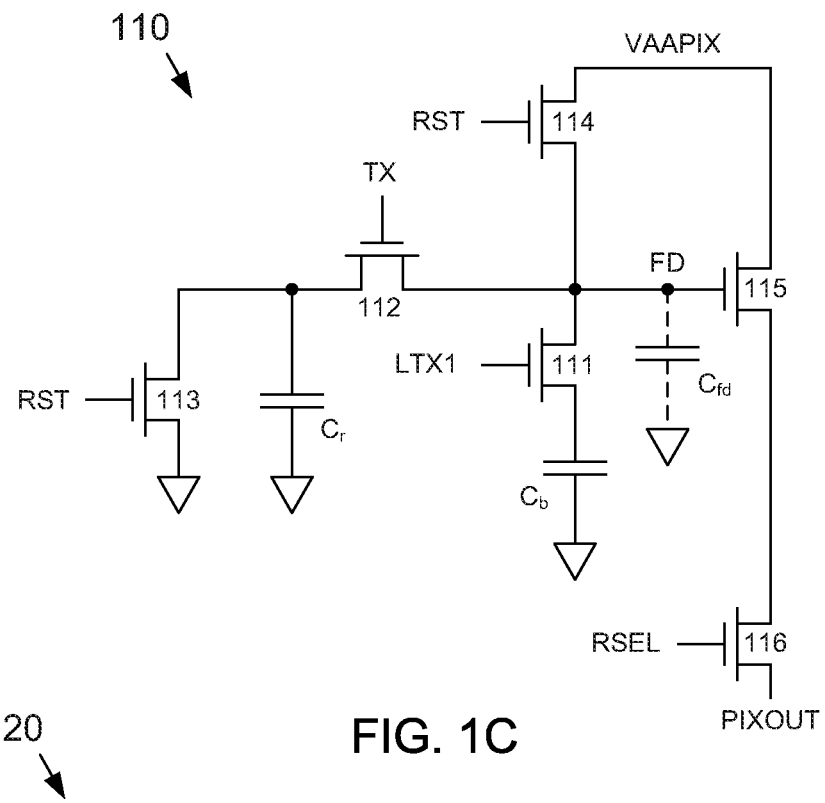
FIG. 1C is a schematic diagram of an example embodiment of a capacitive microbolometer according to the subject matter disclosed herein.

In the following detailed description, numerous specific details are set forth in order to provide a thorough understanding of the disclosure. It will be understood, however, by those skilled in the art that the disclosed aspects may be practiced without these specific details. In other instances, well-known methods, procedures, components and circuits have not been described in detail not to obscure the subject matter disclosed herein.

Reference throughout this specification to "one embodiment" or "an embodiment" means that a particular feature, structure, or characteristic described in connection with the embodiment may be included in at least one embodiment disclosed herein. Thus, the appearances of the phrases "in one embodiment" or "in an embodiment" or "according to one embodiment" (or other phrases having similar import) in various places throughout this specification may not be necessarily all referring to the same embodiment. Furthermore, the particular features, structures or characteristics may be combined in any suitable manner in one or more embodiments. In this regard, as used herein, the word "exemplary" means "serving as an example, instance, or illustration." Any embodiment described herein as "exemplary" is not to be construed as necessarily preferred or advantageous over other embodiments. Additionally, the particular features, structures, or characteristics may be combined in any suitable manner in one or more embodiments. Also, depending on the context of discussion herein, a singular term may include the corresponding plural forms and a plural term may include the corresponding singular form. Similarly, a hyphenated term (e.g., "two-dimensional," "pre-determined," "pixel-specific," etc.) may be occasionally interchangeably used with a corresponding non-hyphenated version (e.g., "two dimensional," "predetermined," "pixel specific," etc.), and a capitalized entry (e.g., "Counter Clock," "Row Select," "PIXOUT," etc.) may be interchangeably used with a corresponding non-capitalized version (e.g., "counter clock," "row select," "pixout," etc.). Such occasional interchangeable uses shall not be considered inconsistent with each other.

Also, depending on the context of discussion herein, a singular term may include the corresponding plural forms and a plural term may include the corresponding singular form. It is further noted that various figures (including component diagrams) shown and discussed herein are for illustrative purpose only, and are not drawn to scale. Similarly, various waveforms and timing diagrams are shown for illustrative purpose only. For example, the dimensions of some of the elements may be exaggerated relative to other elements for clarity. Further, if considered appropriate, reference numerals have been repeated among the figures to indicate corresponding and/or analogous elements.

The terminology used herein is for the purpose of describing some example embodiments only and is not intended to be limiting of the claimed subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement some of the example embodiments disclosed herein.

It will be understood that when an element or layer is referred to as being on, "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement some of the example embodiments disclosed herein.

Unless otherwise defined, all terms (including technical and scientific terms) used herein have the same meaning as commonly understood by one of ordinary skill in the art to which this subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The subject matter disclosed herein relates to an image sensor that may include an LWIR image sensor pixel and to an image sensor that may include a hybrid pixel that combines an LWIR sensor and a CIS into a single pixel. One embodiment of the subject matter disclosed herein provides a pixel for an image sensor that includes an LWIR sensor with low self-heating. In one embodiment, the LWIR sensor may be an LWIR sensor. In another embodiment, the IR sensor may be a near IR (NIR) or a short-wave IR (SWIR) sensor. Another embodiment of the subject matter disclosed herein provides a hybrid pixel for an image sensor that combines an LWIR sensor and a visible light sensor in a single pixel that both share the same low-power readout circuitry. Such a hybrid pixel may be used for advanced driver assist systems (ADAS), a mobile-device imaging system, an industrial imaging system, robotics, etc.

The subject matter disclosed herein also relates to an image sensor having a hybrid pixel that provides thermal-imaging capability and visual-imaging capability in one pixel. In one embodiment, a thermal-imaging portion of the pixel and a visible-imaging portion of the pixel share the same readout circuitry (i.e., a common readout path and circuitry). The hybrid pixel may include a capacitive microbolometer to provide IR imaging and a photodiode to provide visible imaging. A charge-sharing technique may be used to detect, or measure of the capacitance of the capacitive microbolometer. A shared output circuit allows separate thermal-imaging information, separate visible-imaging information or merged thermal/visible-imaging information to be output from the hybrid pixel.

In one embodiment, a thin flat on-chip metasurface lens may be used for LWIR imaging, NIR imaging or both LWIR and NIR imaging. The metasurface lens may include amorphous Si (a-Si) and/or any other dielectric materials that may be transparent to the wavelengths in a desired spectrum. Such a metasurface lens may be fabricated on a flat, transparent substrate at low cost using a single step conventional ultra violet (UV) fabrication technique. Nanostructures may be fabricated with different geometric dimensions and arrangements to focus light at the same focal distance for each wavelength or at different focal distances at the same spatial or at different spatial location according to a desired application. In another embodiment, a thin flat metasurface may include dielectric nanostructures may be used for focusing light at visible-NIR wavelengths (0.4 µm-1 µm) and at LWIR (8 µm-12 µm) wavelengths for simultaneous imaging at visible-NIR and LWIR.

FIGS. 1A and 1B respectively depict example top and side views of a capacitive microbolometer 100 that may be used in the example embodiments of a pixel for an image sensor according to the subject matter disclosed herein. The microbolometer 100 may include an IR absorber paddle 101, one or more biomaterial bending arms 102, one or more support arms 103, and electrodes 104a and 104b that are formed on a substrate 105. The bending arms 102 may be formed from one or more layers of materials that have different coefficients of expansion. For example, the top layers of the bending arms 102 may be formed from a material having a coefficient of expansion that is greater than the coefficient of expansion of a bottom layer material. As the IR absorber paddle 101 absorbs IR radiation, the different coefficients of expansion of the materials of the bending arms cause the electrodes 104a and 104b to move closer together, thereby increasing the capacitance of the microbolometer 100 which can be measured and correlated to a temperature and/or a change in temperature. Alternatively, the top layers of the bending arms 102 may be formed from a material having a coefficient of expansion that is less than the coefficient of expansion of a bottom layer material. As the IR absorber paddle 101 absorbs IR radiation, the different coefficients of expansion of the materials of the bending arms cause the electrodes 104a and 104b to move farther apart together, thereby decreasing the capacitance of the microbolometer 100 which can also be measured and correlated to a temperature and/or a change in temperature. The support arms 103 provide thermal isolation for the IR absorber paddle 101 and bending arms 102 from the substrate 105. The substrate 105 may include circuitry for readout of the microbolometer 100, as described herein.

FIG. 1C is a schematic diagram of an example embodiment of a capacitive microbolometer 110 according to the subject matter disclosed herein. The capacitive microbolometer 110 may include a capacitor $C_b$, a capacitor $C_r$, and field effect transistors (FETs) 111-116.

The capacitor $C_b$ includes a first terminal and a second terminal. The first terminal of the capacitor $C_b$ may be coupled to a first potential, such as ground. The capacitor $C_b$ may be a capacitive microbolometer that changes value as the capacitive microbolometer absorbs IR energy. In one embodiment, the capacitive microbolometer 100 depicted in FIGS. 1A and 1B may be used for the capacitor $C_b$.

The FET 111 includes a first source/drain (S/D) terminal coupled to the second terminal of the capacitor $C_b$. A gate terminal of the FET 111 may be coupled to a LTX1 signal. The FET 112 includes a first S/D terminal coupled to the second S/D terminal of the FET 111. The node at the connection of the second S/D terminal of the FET 111 and the first S/D terminal of the FET 112 may be a floating diffusion (FD). The FD may include a parasitic capacitance $C_{fd}$.

A gate terminal of the FET 112 may be coupled to a TX signal. The second S/D terminal of the FET 112 may be coupled to a first terminal of the capacitor $C_r$. The second terminal of the capacitor $C_r$ may be coupled to the first potential, i.e., ground. The capacitor $C_r$ may be formed to be a regular, or normal, capacitor.

A first S/D terminal of the FET 113 may be coupled to the second S/D terminal of the FET 112 and the first terminal of the capacitor $C_r$. A second S/D terminal of the FET 113 may be coupled to ground. A gate terminal of the FET 113 may be coupled to an RST signal.

A first S/D terminal of the FET 114 may be coupled to the second S/D terminal of the FET 111 and the first S/D terminal of the FET 112. A second S/D terminal of the FET 114 may be coupled to a second potential, such as VAAPIX. A gate terminal of the FET 114 may be coupled to the RST signal.

A gate terminal of the FET 115 may be coupled to the FD node. A first S/D terminal of the FET 115 may be coupled to the second potential (i.e., VAAPIX). A second S/D terminal of the FET 115 may be coupled to a first S/D terminal of the FET 116. A gate terminal of the FET 116 may be coupled to a RSEL signal, and the second S/D terminal of the FET 116 may be coupled to a PIXOUT line.

Figure 1D:
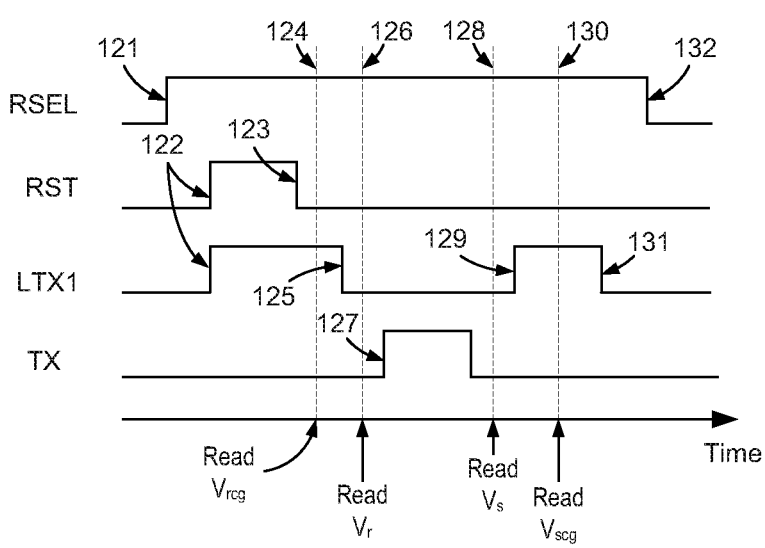
FIG. 1D is an example relative timing diagram for reading information out of the capacitive microbolometer of FIG. 1C according to the subject matter disclosed herein.

FIG. 1D is an example relative timing diagram 120 for reading information out of the capacitive microbolometer 110 of FIG. 1C according to the subject matter disclosed herein. As previously mentioned, the capacitor $C_b$ may be a capacitive bolometer, the capacitor $C_r$ may be a regular, or normal, capacitor, and the FD node may include a parasitic capacitance $C_{fd}$.

In the relative timing diagram 120, time advances toward the right. Initially, the four signals in the timing diagram 120 are low. At 121, the RSEL signal goes high, turning on the FET 116 to select the capacitive microbolometer 110 for read out. At 122, the RST signal and the LTX1 signal both go high, presetting the capacitor $C_r$ to 0V and resetting capacitor $C_b$ and the FD node (i.e., $C_{fd}$) to high. At 123, the RST signal goes low, turning off the FETs 103 and 104, and LTX1 remains high keeping the FET 111 turned on. At 124, a value $V_{reg}$ is output (or read) from the FET 116 at PIXOUT. The value $V_{reg}$ is the voltage on $C_b$ and $C_{fd}$. At 125, the LTX1 signal goes low, turning off the FET 111. At 126, a value $V_r$ is output (or read) from the FET 116 at PIXOUT. The value $V_r$ is the voltage on the FD node. At 127, the TX signal goes high, turning on the FET 112 to transfer charge (i.e., a charge-sharing technique) from $C_r$ to the FD. At 128, a value $V_s$ is output (or read) from the FET 116 at PIXOUT.

The readings made to this point include:

$$V_{reg} = C_b + C_{fd} = VAAPIX, \quad (1)$$

$$V_r = VAAPIX, \text{ and} \quad (2)$$

$$V_s = \frac{V_r * C_r}{(C_{fd} + C_r)}. \quad (3)$$

At 129, the LTX1 signal goes high, turning on the FET 111. At 130, a value $V_{seg}$ is output (or read) from the FET 116 at PIXOUT. At 131, the DCG signal goes low, and at 132, the RSEL signal goes low. The capacitance value of the capacitor $C_b$ may be determined from the following equation.

$$V_{seg} = \frac{V_s * (C_{fd} + C_r)}{(C_{fd} + C_r + C_b)}. \quad (4)$$

Figure 2A:
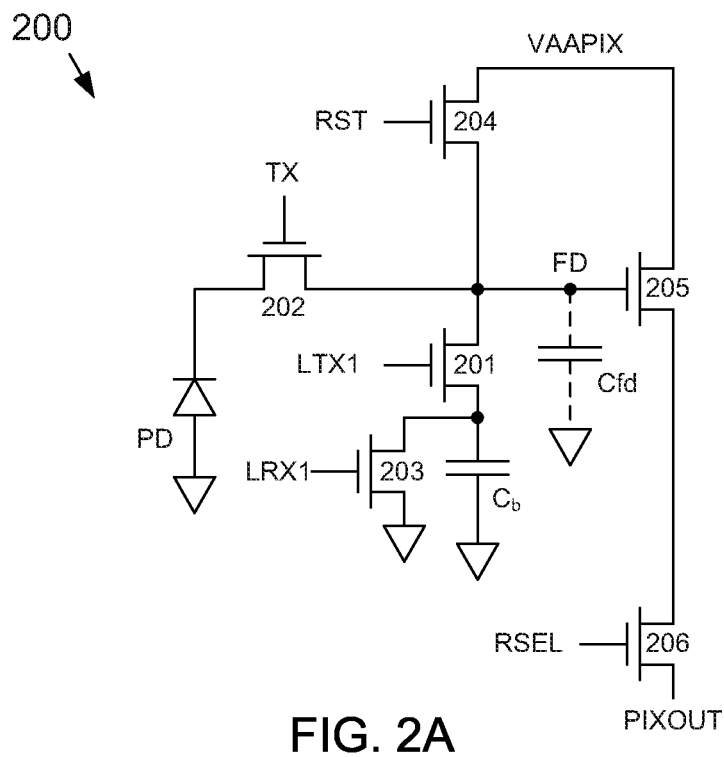
FIG. 2A is a schematic diagram of an example embodiment of a hybrid pixel that includes a capacitive microbolometer and a photodiode according to the subject matter disclosed herein.

FIG. 2A is a schematic diagram of an example embodiment of a hybrid pixel 200 that includes a capacitive microbolometer and a photodiode according to the subject matter disclosed herein. The architecture of the hybrid pixel 200 also provides a shared common read-out path for IR-imaging information and visible-light imaging information.

The hybrid pixel 200 may include a capacitor $C_b$, a photodiode PD and FETs 201-206. The capacitor $C_b$ includes a first terminal and a second terminal. The second terminal of the capacitor $C_b$ may be coupled to a first potential, such as ground. The capacitor $C_b$ may be a capacitive microbolometer that changes value as the capacitive microbolometer absorbs IR energy.

The FET 201 includes a first S/D terminal coupled to the first terminal of the capacitor $C_b$. A gate terminal of the FET 201 may be coupled to a LTX1 signal. The FET 202 includes a first S/D terminal coupled to the second S/D terminal of the FET 201. The node to which the second S/D terminal of the FET 201 is coupled to the first S/D terminal of the FET 202 may be an FD node. The FD node may include a parasitic capacitance $C_{fd}$.

A gate terminal of the FET 202 may be coupled to a TX signal. The second S/D terminal of the FET 202 may be coupled to a first terminal of the photodiode PD. The second terminal of the photodiode PD may be coupled to the first potential, i.e., ground.

A first S/D terminal of the FET 203 may be coupled to the first S/D terminal of the FET 201 and the first terminal of the capacitor $C_b$. A second S/D terminal of the FET 203 may be coupled to ground. A gate terminal of the FET 203 may be coupled to an LRX1 signal.

A first S/D terminal of the FET 204 may be coupled to the second S/D terminal of the FET 201 and the first S/D terminal of the FET 202. A second S/D terminal of the FET 204 may be coupled to a second potential, such as VAAPIX. A gate terminal of the FET 204 may be coupled to the RST signal.

A gate terminal of the FET 205 may be coupled to the FD. A first S/D terminal of the FET 205 may be coupled to the second potential (i.e., VAAPIX). A second S/D terminal of the FET 205 may be coupled to a first S/D terminal of the FET 206. A gate terminal of the FET 206 may be coupled to a RSEL signal, and the second S/D terminal of the FET 206 may be coupled to a PIXOUT line.

The hybrid pixel 202 may be selectively operated to sense a thermal image using the bolometer capacitance $C_b$, and/or to sense a visual image using the photodiode PD. The information sensed for the thermal image, the information sensed for the visual image, or the information for the combination of both the thermal image and the visual image may be selectively output from the hybrid pixel 202 through FET 206 to the shared PIXOUT line.

Figure 2B:
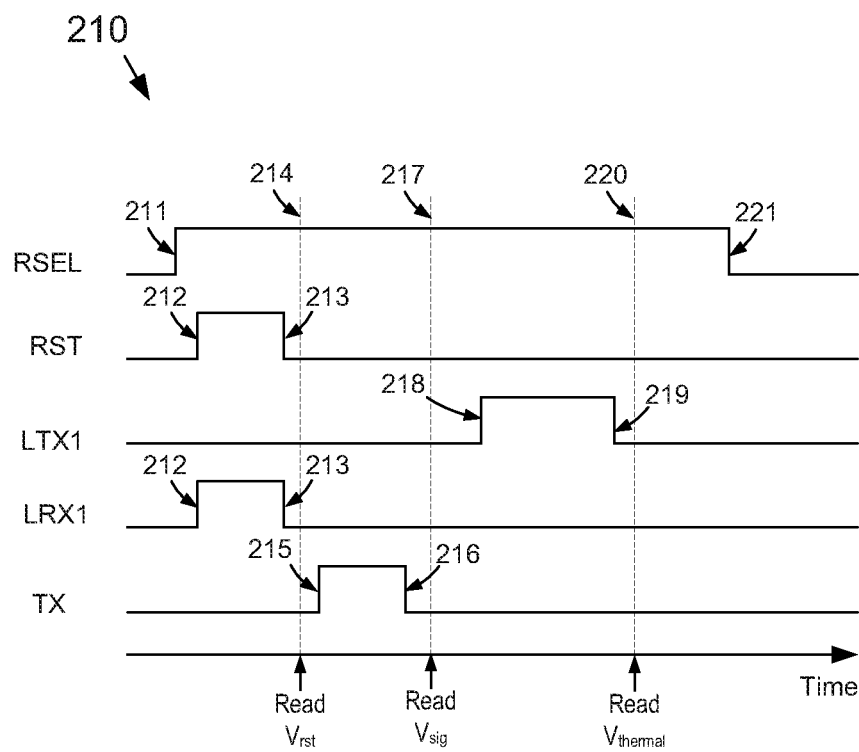
FIG. 2B is an example relative timing diagram for reading thermal-imaging information and visible-imaging information out of the hybrid pixel of FIG. 2A according to the subject matter disclosed herein.

FIG. 2B is an example relative timing diagram 210 for reading thermal-imaging information and visible-imaging information out of the hybrid pixel 200 of FIG. 2A according to the subject matter disclosed herein. Reading visual-imaging information will be described first, followed by reading thermal-imaging information from the hybrid pixel 200.

In the relative timing diagram 210, time advances toward the right. Initially, the five signals shown in FIG. 2B are all low. At 211, the RSEL signal goes high, turning on the FET 206 to select the hybrid pixel 200 for read out. At 212, the FD node is reset by the RST signal going high, and the capacitor $C_b$ is reset by the LRX1 signal going high. After the RST and the LRX1 signals go low at 213, a reset level $V_{rst}$ signal may be read at 214 and output from the FET 206 at the PIXOUT line. At 215, the TX signal goes high. After the TX signal goes low at 216, the PD signal $V_{sig}$ is read at 217 and is output from the FET 206 at the PIXOUT line.

At 218, the LTX1 signal goes high, turning on the FET 201. The FET 201 is turned off at 219. At 220, a value $V_{thermal}$ is read and output from the FET 206 at PIXOUT based on charge sharing between $C_b$ and $C_{fd}$. Alternatively, the value $V_{thermal}$ may be read while the LTX1 signal is high. At 221, the RSEL signal goes low.

Figure 2C:
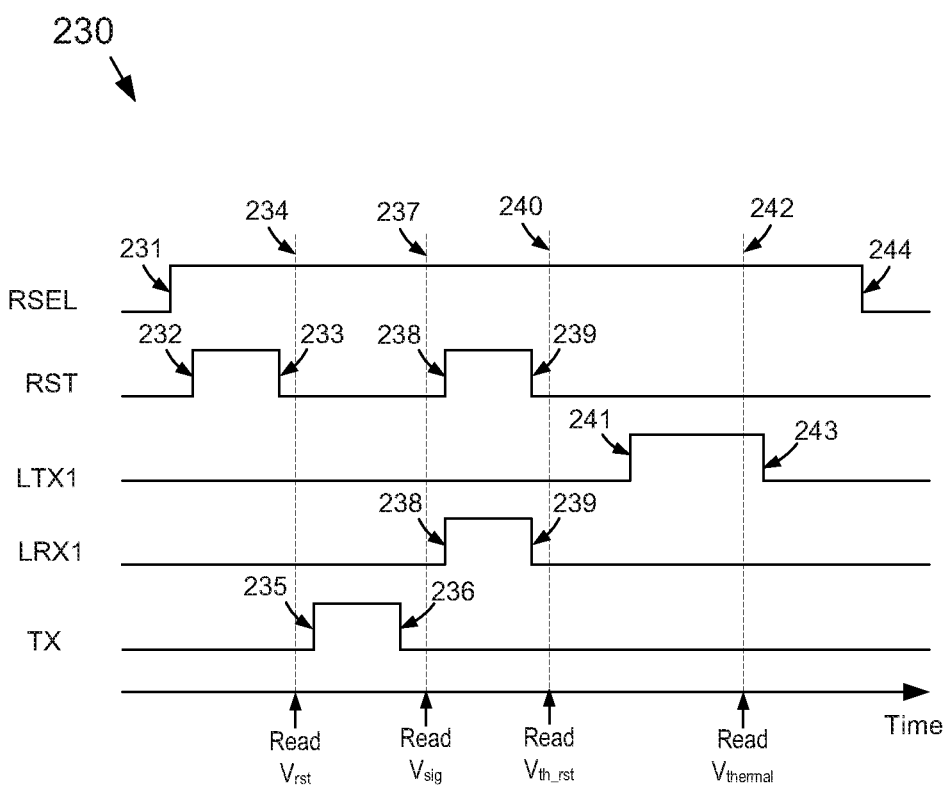
FIG. 2C is an alternative example timing diagram for reading visible imaging information and thermal imaging information out of the hybrid pixel of FIG. 2A according to the subject matter disclosed herein.

FIG. 2C is an alternative example timing diagram 230 for reading visible imaging information and thermal imaging information out of the hybrid pixel 200 of FIG. 2A according to the subject matter disclosed herein. Reading visual-imaging information will be described first, followed by reading thermal-imaging information from the hybrid pixel 200.

In the relative timing diagram 230, time advances toward the right. Initially, the five signals shown in FIG. 2C are all low. At 231, the RSEL signal goes high, turning on the FET 206 to select the hybrid pixel 200 for read out. At 232, the FD node is reset by the RST signal going high, and the capacitor $C_b$ is reset by the LRX1 signal going high. After the RST and the LRX1 signals go low at 233, a reset level $V_{rst}$ signal may be read at 234 and output from the FET 206 at the PIXOUT line. At 235, the TX signal goes high. After the TX signal goes low at 236, the PD signal $V_{sig}$ is read at 237 and is output from the FET 206 at the PIXOUT line.

At 238, the FD node is reset by the RST signal going high, and the capacitor $C_b$ is reset by the LRX1 signal going high. After the RST and the LRX1 signals go low at 239, a reset level $V_{th\_rst}$ signal may be read at 240 and is output from the FET 206 at the PIXOUT line. At 241, the LTX1 signal goes high, turning on the FET 201. At 242, a value $V_{thermal}$ is read and output from the FET 206 at PIXOUT. At 243, the LTX1 signal goes low, and at 244, the RSEL signal goes low. The capacitance value $C_b$ may be obtained through charge sharing of $C_b$ and $C_{fd}$ from the following equation:

$$V_{thermal} = \frac{C_{fd} * V_r}{(C_{fd} + C_{fd} + C_b)}. \quad (5)$$

Figure 3:
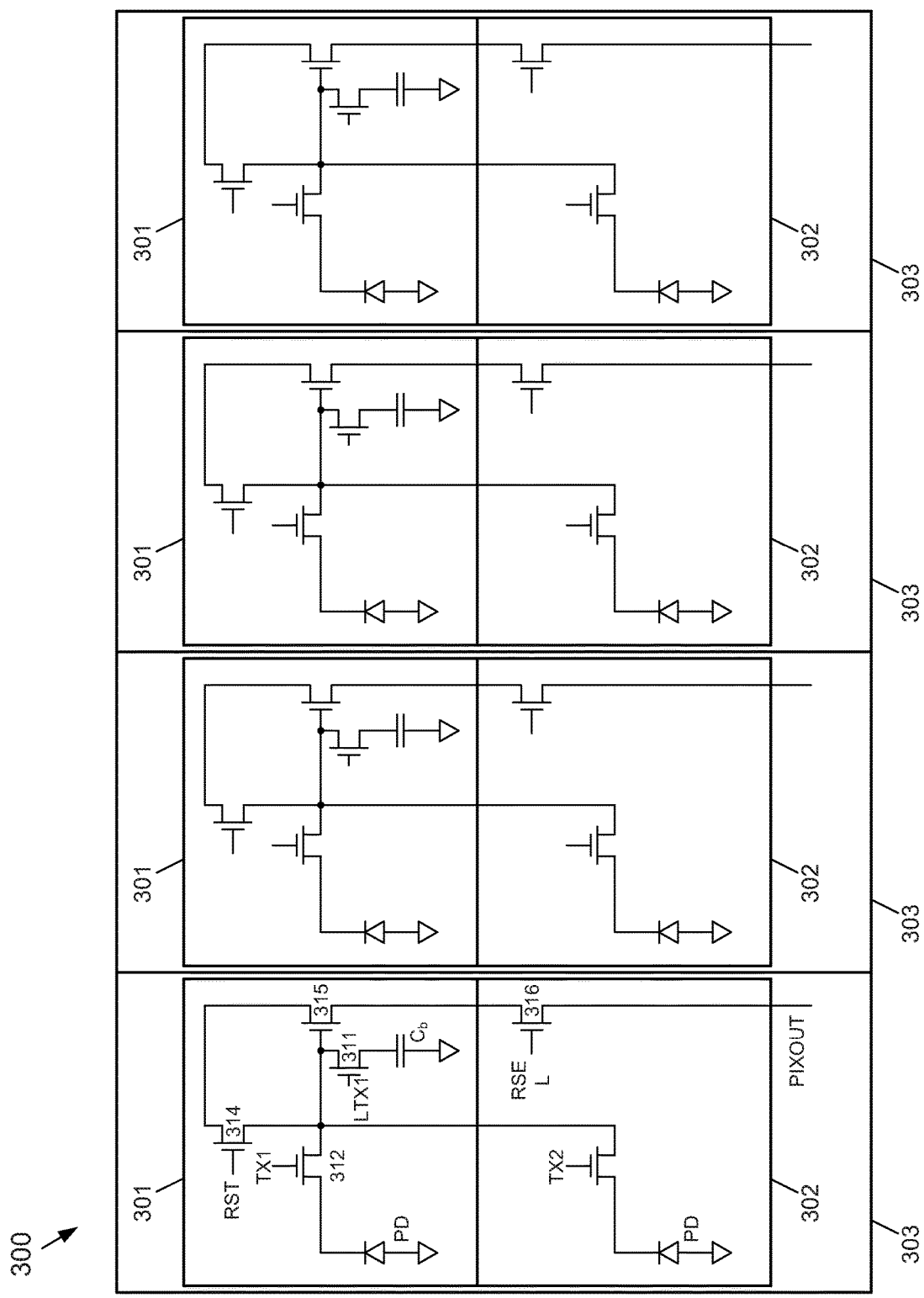
FIG. 3 depicts a schematic diagram of an example embodiment of a portion of an array of hybrid pixels and CIS pixels according to the subject matter disclosed herein.

FIG. 3 depicts a schematic diagram of an example embodiment of a portion of an array 300 of hybrid pixels 301 and CIS pixels 302 according to the subject matter disclosed herein. In the array 300, a hybrid pixel 301 has been paired with a CIS pixel 302 to form a pixel pair 303. Additionally, the hybrid pixels 301 and the CIS pixels 302 depicted in FIG. 3 are shown with only representative components and representative signals. There may be other components (not shown) that may be part of a hybrid pixel 301 or that may be part of a CIS pixel 302.

The pairing of a hybrid pixel with a CIS pixel, or the pairing of two or more CIS pixels with a capacitive microbolometer pixel may improve image quality and/or low-light image-sensing capability, such as image sensing at night, or high ambient light conditions through a pixel-level binning technique to improve image quality (SNR). In another embodiment, two or more capacitive microbolometer pixels may be paired with a CIS pixel to provide an improved IR-image sensing capability.

The pixel pair 303 in FIG. 3 may provide that a total of two visible image sensor portions of the pixels share an output path with one microbolometer sensor portion. That is, a hybrid pixel 301 includes a visible image sensor portion (e.g., the portion with a photodiode) and a microbolometer sensor portion (e.g., the portion with a microbolometer). A CIS pixel 302 includes only a visible image sensor portion, in which case the entire CIS pixel may be referred to herein as a visible image sensor portion or a visible pixel. FIG. 3 depicts four pairs of hybrid pixels and CIS pixels. It will be understood that the array 300 may include more than or less than the four pairs of hybrid and CIS pixels depicted in FIG. 3.

Figure 4A:
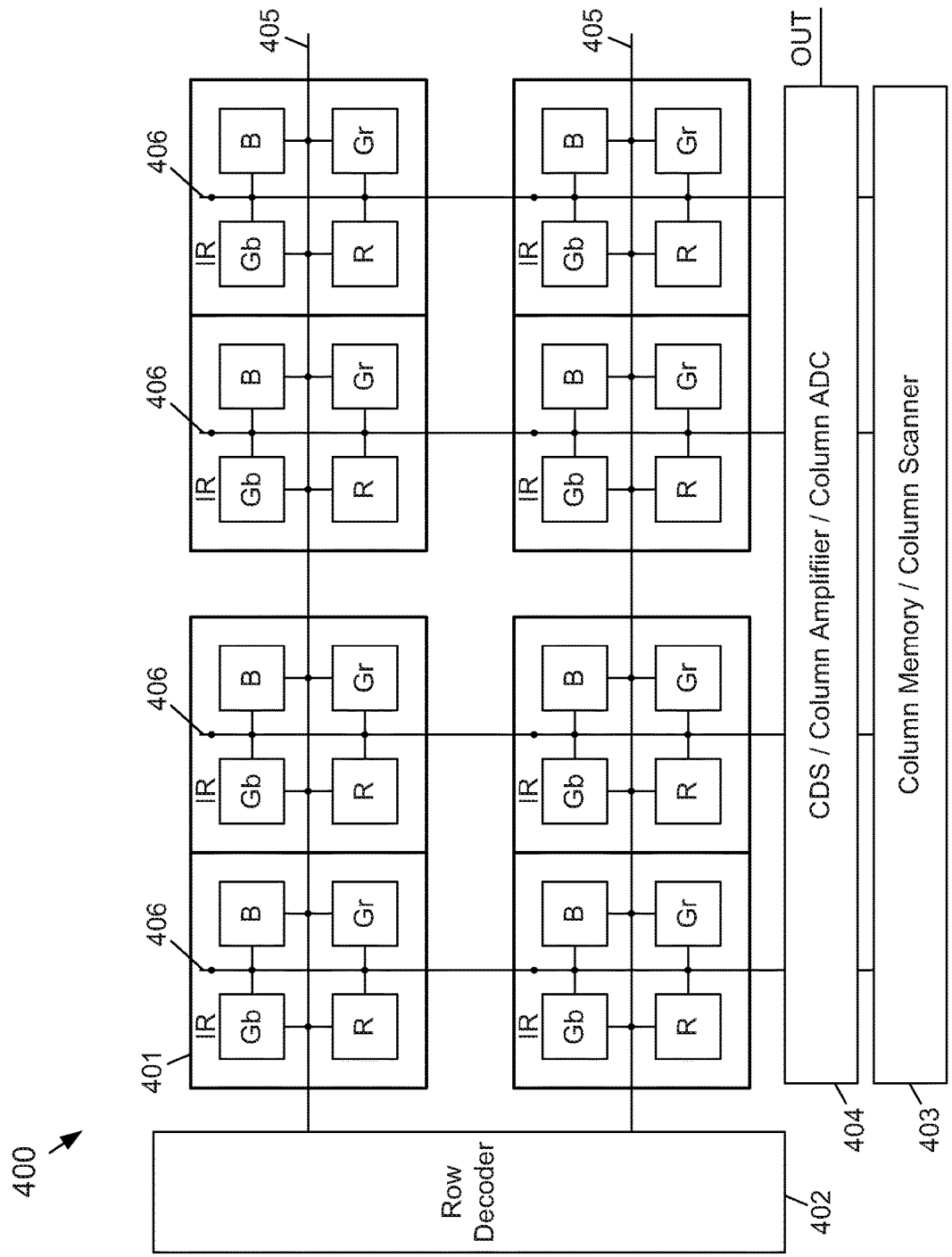

FIG. 4A depicts an example embodiment of a portion of another array 400 of hybrid pixels 401 according to the subject matter disclosed herein. The array 400 may be used with a backside illuminated (BSI) image sensor or a stacked image sensor in which the peripheral components may be located on a die or substrate that is different from the die or substrate on which the array 400 is located.

In the array 400, a hybrid pixel 400 includes four visible sensor portions and one microbolometer portion that share an output path. For example, a hybrid pixel 401a includes four visible sensor portions indicated as red (R), green (Gb and Gr) and blue (B). The hybrid pixel 401a also includes one microbolometer portion, indicated as IR. In one embodiment, the IR pixel may be physically as large as the four visible sensor portions that with which the IR pixel shares an output path.

Peripheral components may include a row decoder 402 and a column decoder 403 that may be connected to the array 400 as depicted. One embodiment may include peripheral components 404 for correlated double sampling (CDS), column amplifiers and/or column analog-to-digital converters (ADCs). Rows 405 may extend from the row decoder 402, and output paths 406 (e.g., PIXOUT paths) may extend from the hybrid pixels 400 to the components 404 and/or the column decoder 403. An output may be obtained at OUT.

Figure 4B:
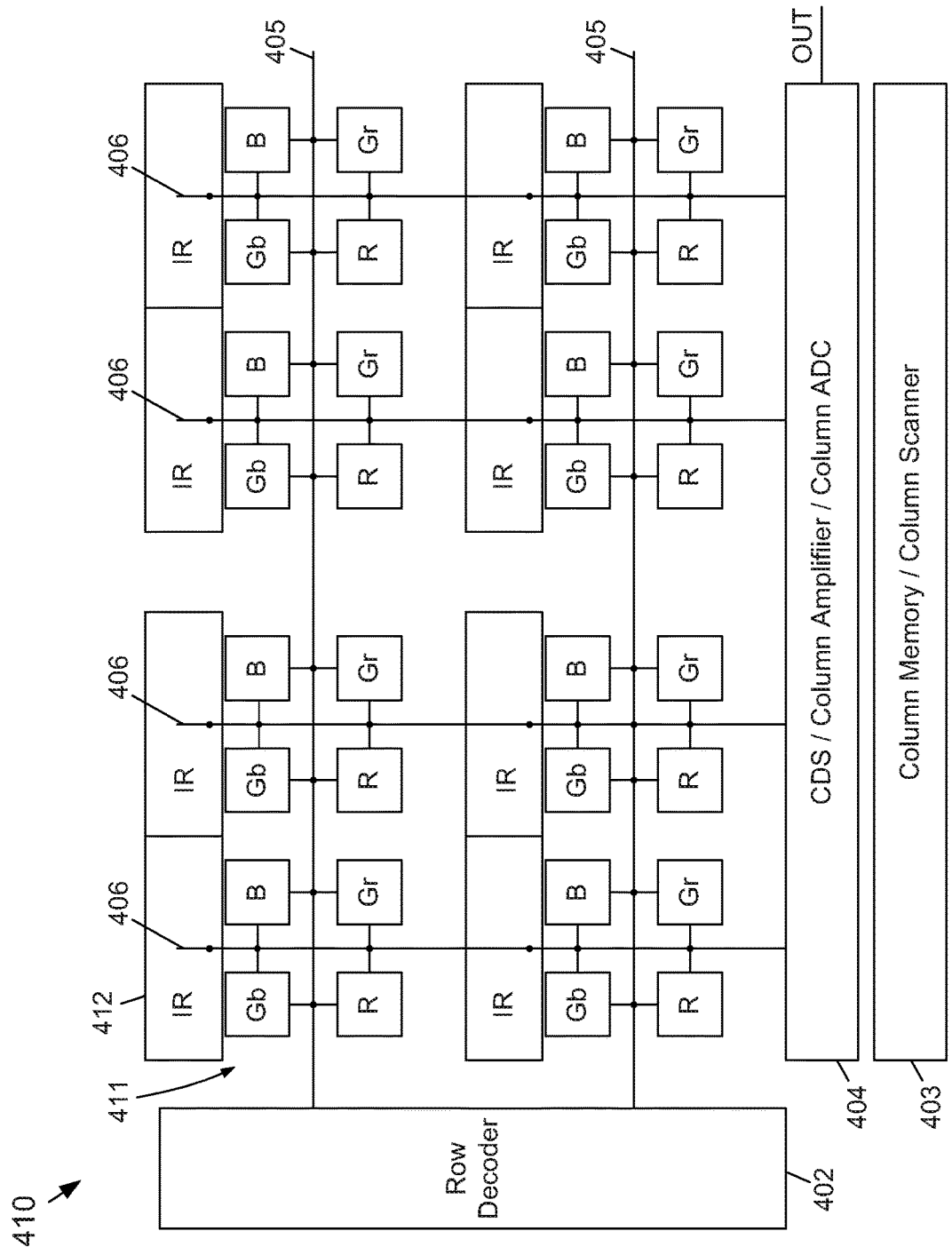

FIG. 4B depicts an example embodiment of a portion of an array 410 of visible pixels 411 and capacitive microbolometer pixels 412 according to the subject matter disclosed herein. The array 410 may be used with a frontside illuminated (FSI) or a backside illuminated (BSI) image sensor.

In the array 410, four visible CIS pixels and one microbolometer IR pixel share an output path. For example, four visible CIS pixels indicated as (R), Gb, Gr, and B and an IR pixel share an output path. In one embodiment, the IR pixel may be located adjacent to the four visible CIS pixels.

Peripheral components for the array 410 may include a row decoder 413 and a column decoder 414 that may be connected to the array 410 as depicted. One embodiment may include peripheral components 415 for correlated double sampling (CDS), column amplifiers and/or column analog-to-digital converters (ADCs). Rows 416 may extend from the row decoder 413, and output paths 417 (e.g., PIXOUT paths) may extend from the hybrid pixels 410 to the components 415 and/or the column decoder 414. An output may be obtained at OUT.

Figures 4C, 4D, 4E, 4F, 4G, 4H:
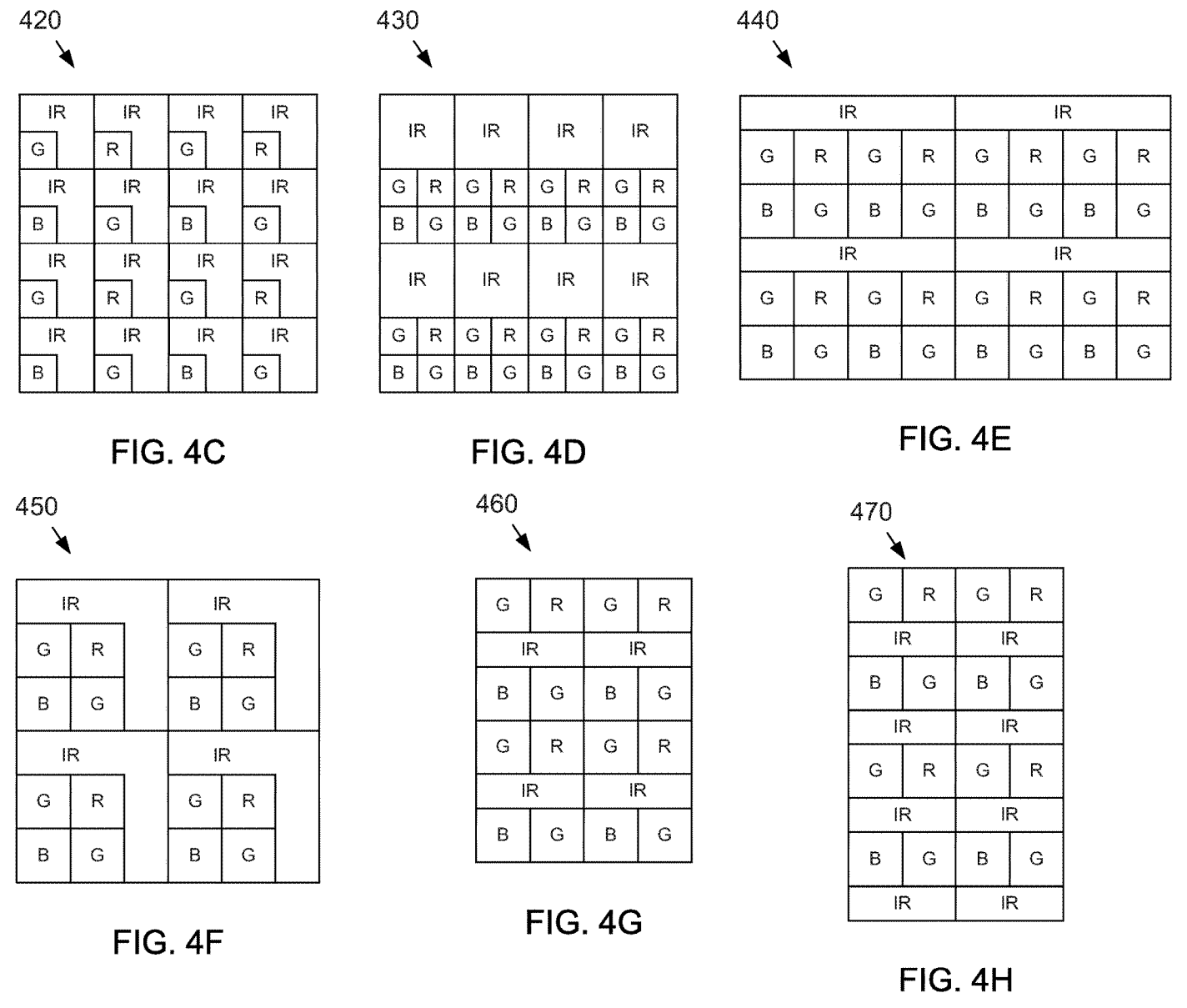

FIGS. 4C-4J respectively depict example embodiments of arrays of different physical arrangements or placements of hybrid pixels or of visible pixels (R,G,B) and microbolometer pixels (IR) according to the subject matter disclosed herein. The arrays depicted in FIGS. 4C-4J may be used with FSI image sensors. FIG. 4C depicts an example array 420 in which each pixel is a hybrid pixel similar to the hybrid pixel 110 depicted in FIG. 1C. FIG. 4D depicts an example array 430 in which four visible CIS pixels share one microbolometer pixel IR. FIG. 4E depicts an example array 440 in which eight visible CIS pixels share one microbolometer pixel IR.

Figures 4I, 4J:

FIGS. 4F and 4G respectively depict example arrays 450 and 460 in which four visible CIS pixels share one microbolometer pixel IR. FIG. 4H depicts an example array 470 in which two CIS pixels share one microbolometer pixel IR. FIG. 4I depicts an example array 480 in which four CIS pixels share one microbolometer pixel IR. FIG. 4J depicts an example array 490 in which two CIS pixels share one microbolometer pixel IR.

Figure 5A:
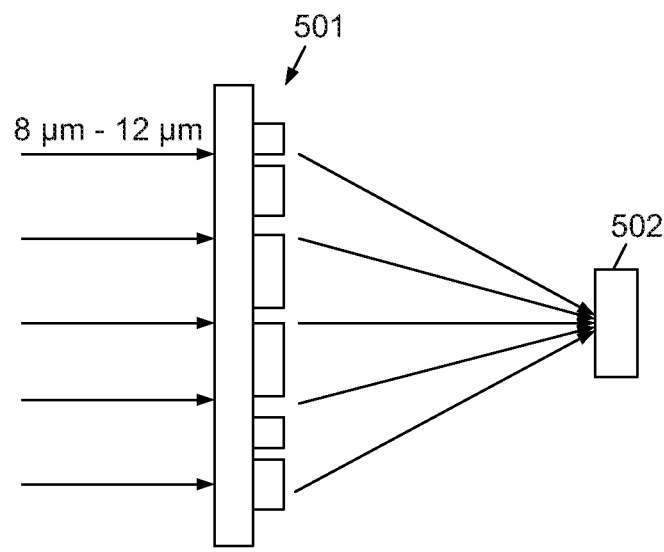
FIG. 5A depicts an example embodiment of optics that may be used with the microbolometer pixels disclosed herein.

FIG. 5A depicts an example embodiment of optics that may be used with the microbolometer pixels disclosed herein. The optics may include a global lens 501 that focuses infrared radiation having, for example, wavelengths between about 8 μm and about 12 μm, toward an array of microbolometers 502. In one embodiment, the global lens 501 may be a thin flat on-chip metasurface lens may be used for LWIR imaging, NIR imaging or both LWIR and NIR imaging. The metasurface lens may be formed from nanostructures that include amorphous Si (a-Si) and/or any other dielectric materials that may be transparent to the wavelengths in a desired spectrum. Such a metasurface lens may be fabricated on a flat, transparent substrate at low cost using a single step conventional ultra violet (UV) fabrication technique. Nanostructures may be fabricated with different geometric dimensions and arrangements to focus light at the same focal distance for each wavelength or at different focal distances at the same spatial or at different spatial location according to a desired application. In another embodiment, a thin flat metasurface may include dielectric nanostructures may be used for focusing light at visible-NIR wavelengths (0.4 μm-1 μm) and at LWIR (8 μm-12 μm) wavelengths for simultaneous imaging at visible-NIR and LWIR.

Figure 5B:
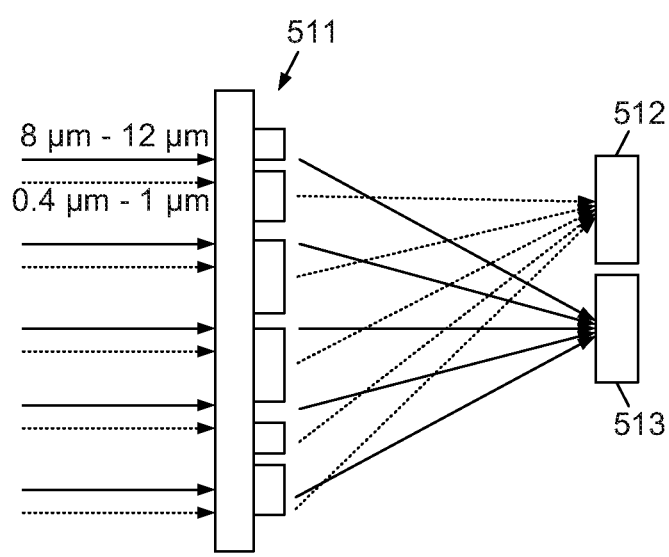
FIG. 5B depicts an example embodiment of optics that may be used with the hybrid pixels and the microbolometer pixels disclosed herein.

FIG. 5B depicts an example embodiment of optics that may be used with the hybrid pixels and the microbolometer pixels disclosed herein. The optics may include a global lens 511 that focuses different wavelengths of light or radiant energy to different locations on one or more arrays 512 and 513. The array 512 may include, for example, hybrid pixels, visible CIS pixels and/or capacitive microbolometer pixels, and the array 513 may include, for example, capacitive microbolometer pixels. The global lens 511 may focus wavelengths from, for example, between about 0.4 μm to about 1 μm to one or more different locations on the array 512, and may focus wavelengths from, for example, between about 8 μm and about 12 μm to one or more locations on the array 513. Although the arrays 512 and 513 are depicted as being two separate arrays, it should be understood that the arrays 512 and 513 may in some embodiments be a single array.

Figure 5C:
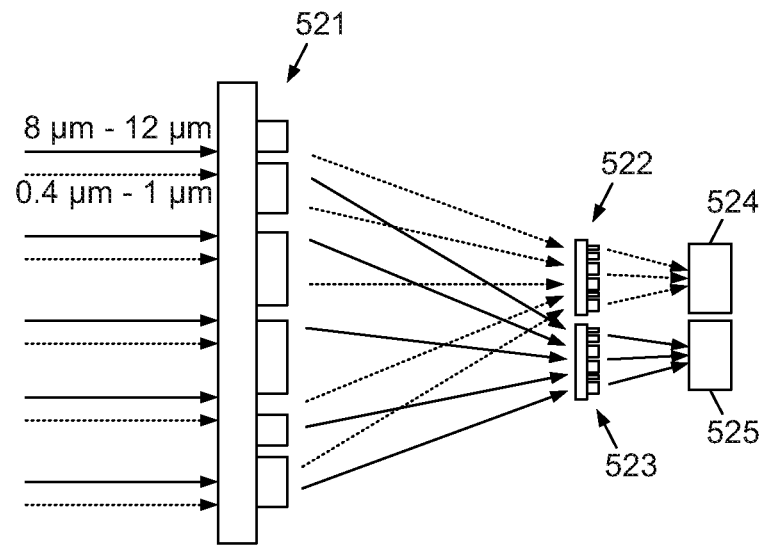
FIG. 5C depicts another example embodiment of optics that may be used with the hybrid pixels and the microbolometer pixels disclosed herein.

FIG. 5C depicts another example embodiment of optics that may be used with the hybrid pixels and the microbolometer pixels disclosed herein. The optics may include a global lens 521 that focuses different wavelengths of visible light and infrared energy to one or more different microlenses 522 and 523. The microlenses 522 and 523, in turn, may focus the different wavelengths of visible light and infrared energy to one or more different arrays 524 and 525. For example, the microlens 522 may focus wavelengths from between about 8 µm and about 12 µm to one or more locations on an array 524 that may contain one or more hybrid pixels. Similarly, the microlens 523 may focus wavelengths from between about 0.4 µm to about 1 µm to one or more different locations on an array 525 that may contain capacitive microbolometer pixels. Although the arrays 524 and 525 are depicted as being two separate arrays, it should be understood that the arrays 524 and 525 may in some embodiments be a single array.

Figure 5D:
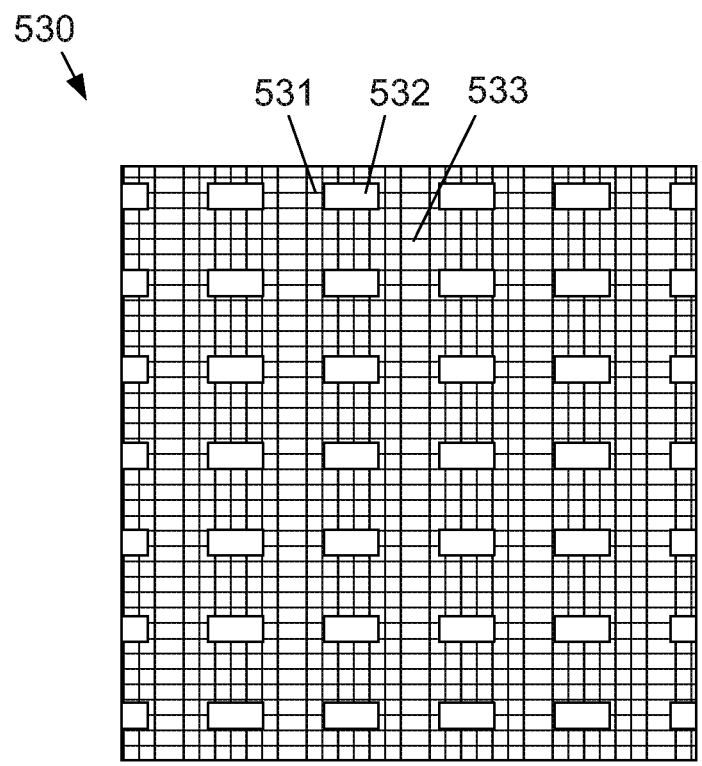
FIG. 5D depicts an example embodiment of a layout of an array that contains hybrid pixels, capacitive microbolometers, and/or visible light CIS pixels as disclosed herein.

FIG. 5D depicts an example embodiment of a layout of an array 530 that contains hybrid pixels 531, capacitive microbolometers 531, and/or visible light CIS pixels 533 as disclosed herein. Other layout arrangements are possible.

Figure 6:
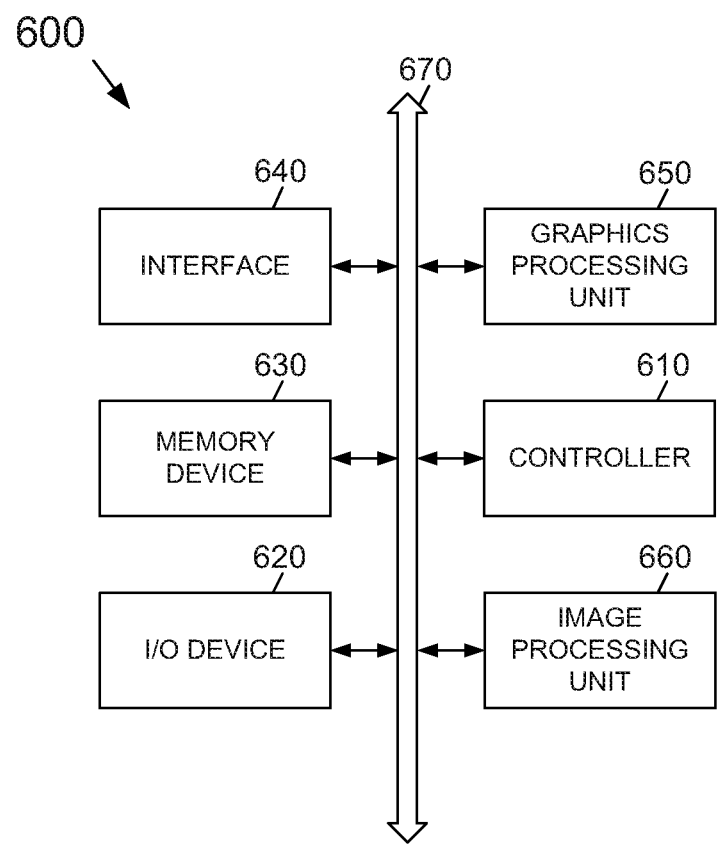
FIG. 6 depicts an electronic device that includes an image processing unit that includes a capacitive microbolometer pixel and/or a hybrid pixel according to the subject matter disclosed herein.

FIG. 6 depicts an electronic device 600 that includes an image processing unit that includes a capacitive microbolometer pixel and/or a hybrid pixel according to the subject matter disclosed herein. Electronic device 600 may be used in, but not limited to, a computing device, a personal digital assistant (PDA), a laptop computer, a mobile computer, a web tablet, a wireless phone, a cell phone, a smart phone, a digital music player, or a wireline or wireless electronic device. The electronic device 600 may also be part of, but not limited to, an ADAS, a mobile-device imaging system, an industrial imaging system, robotics, etc. The electronic device 600 may include a controller 610, an input/output device 620 such as, but not limited to, a keypad, a keyboard, a display, a touch-screen display, a camera, and/or an image sensor, a memory 630, an interface 640, a GPU 650, and an imaging processing unit 660 that are coupled to each other through a bus 670. The controller 610 may include, for example, at least one microprocessor, at least one digital signal processor, at least one microcontroller, or the like. The memory 630 may be configured to store a command code to be used by the controller 610 or a user data.

Electronic device 600 and the various system components of electronic device 600 may include the image processing unit 660, which includes a capacitive microbolometer pixel and/or a hybrid pixel according to the subject matter disclosed herein. The interface 640 may be configured to include a wireless interface that is configured to transmit data to or receive data from a wireless communication network using a RF signal. The wireless interface 640 may include, for example, an antenna, a wireless transceiver and so on. The electronic system 600 also may be used in a communication interface protocol of a communication system, such as, but not limited to, Code Division Multiple Access (CDMA), Global System for Mobile Communications (GSM), North American Digital Communications (NADC), Extended Time Division Multiple Access (E-TDMA), Wideband CDMA (WCDMA), CDMA2000, Wi-Fi, Municipal Wi-Fi (Muni Wi-Fi), Bluetooth, Digital Enhanced Cordless Telecommunications (DECT), Wireless Universal Serial Bus (Wireless USB), Fast low-latency access with seamless handoff Orthogonal Frequency Division Multiplexing (Flash-OFDM), IEEE 802.20, General Packet Radio Service (GPRS), iBurst, Wireless Broadband (WiBro), WiMAX, WiMAX-Advanced, Universal Mobile Telecommunication Service-Time Division Duplex (UMTS-TDD), High Speed Packet Access (HSPA), Evolution Data Optimized (EVDO), Long Term Evolution-Advanced (LTE-Advanced), Multichannel Multipoint Distribution Service (MMDS), and so forth.

Embodiments of the subject matter and the operations described in this specification may be implemented in digital electronic circuitry, or in computer software, firmware, or hardware, including the structures disclosed in this specification and their structural equivalents, or in combinations of one or more of them. Embodiments of the subject matter described in this specification may be implemented as one or more computer programs, i.e., one or more modules of computer-program instructions, encoded on computer-storage medium for execution by, or to control the operation of, data-processing apparatus. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus. A computer-storage medium can be, or be included in, a computer-readable storage device, a computer-readable storage substrate, a random or serial-access memory array or device, or a combination thereof. Moreover, while a computer-storage medium is not a propagated signal, a computer-storage medium may be a source or destination of computer-program instructions encoded in an artificially-generated propagated signal. The computer-storage medium can also be, or be included in, one or more separate physical components or media (e.g., multiple CDs, disks, or other storage devices). Additionally, the operations described in this specification may be implemented as operations performed by a data-processing apparatus on data stored on one or more computer-readable storage devices or received from other sources.

While this specification may contain many specific implementation details, the implementation details should not be construed as limitations on the scope of any claimed subject matter, but rather be construed as descriptions of features specific to particular embodiments. Certain features that are described in this specification in the context of separate embodiments may also be implemented in combination in a single embodiment. Conversely, various features that are described in the context of a single embodiment may also be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described herein. Other embodiments are within the scope of the following claims. In some cases, the actions set forth in the claims may be performed in a different order and still achieve desirable results. Additionally, the processes depicted in the accompanying figures do not necessarily require the particular order shown, or sequential order, to achieve desirable results. In certain implementations, multitasking and parallel processing may be advantageous.

As will be recognized by those skilled in the art, the innovative concepts described herein may be modified and varied over a wide range of applications. Accordingly, the scope of claimed subject matter should not be limited to any of the specific exemplary teachings discussed above, but is instead defined by the following claims.

What is claimed is:

1. A pixel for an image sensor, comprising:
a microbolometer sensor portion that outputs a signal corresponding to an infrared (IR) image sensed by the microbolometer sensor portion;
a visible image sensor portion that outputs a signal corresponding to a visible image sensed by the visible image sensor portion, a capacitance of the microbolometer sensor portion varying based on an amount of IR energy absorbed by the microbolometer sensor portion, and the capacitance of the microbolometer sensor portion being based on a ratio of a reset voltage level of the microbolometer sensor portion to an IR image voltage level of the microbolometer sensor portion; and
a floating diffusion of the pixel that is shared by the microbolometer sensor portion and the visible image sensor portion, the microbolometer sensor portion and the visible image sensor portion being controlled to selectively output the signal corresponding to the IR image or the signal corresponding to the visible image to the floating diffusion.

2. The pixel of claim 1, wherein the microbolometer sensor portion comprises a capacitive microbolometer sensor.

3. The pixel of claim 2, wherein the visible image sensor portion comprises a photodiode.

4. The pixel of claim 1, wherein the pixel comprises one pixel of an array of pixels.

5. The pixel of claim 4, wherein the array of pixels comprises one or more additional pixels comprising:
a microbolometer sensor portion that outputs a signal corresponding to an IR image sensed by the microbolometer sensor portion of the additional pixel; and
a visible image sensor portion that outputs a signal corresponding to a visible image sensed by the visible image sensor portion of the additional pixel,
the floating diffusion being shared by the microbolometer sensor portion and the visible image sensor portion of the additional pixel, and the microbolometer sensor portion and the visible image sensor portion of the additional pixel being controlled to selectively output to the floating diffusion of the additional pixel the signal corresponding to the IR image sensed by the microbolometer sensor portion of the additional pixel or the signal corresponding to the visible image sensed by the visible image sensor portion of the additional pixel.

6. The pixel of claim 1, further comprising an output path that is shared with a visible image sensor portion of at least one additional pixel, the visible image sensor portion of the additional pixel outputting a signal corresponding to a visible image sensed by the visible image sensor portion of the additional pixel, and
wherein the output path being further controlled to selectively output the signal corresponding to the IR image, the signal corresponding to the visible image of the visible image sensor portion of the pixel, or the signal corresponding to a visible image of the visible image sensor portion of the additional pixel.

7. The pixel of claim 6, wherein the output path is shared by two visible image sensor portions.

8. The pixel of claim 6, wherein the output path is shared by one of four visible image sensor portions, and eight visible image sensor portions.

9. The pixel of claim 1, wherein the capacitance of the microbolometer sensor portion is further based on a capacitance of the floating diffusion of the pixel multiplied by a quantity of 1 minus the ratio of a reset voltage level of the microbolometer sensor portion to an image voltage level of the microbolometer sensor portion.

10. An image sensor, comprising:
an array of pixels that includes at least one pixel pair that comprises a first pixel and a second pixel,
the first pixel comprising:
a capacitive microbolometer sensor portion that outputs a signal corresponding to an infrared (IR) image sensed by the microbolometer sensor portion;
a visible image sensor portion that outputs a signal corresponding to a visible image sensed by the visible image sensor portion of the first pixel;
the second pixel comprising:
a visible image sensor portion that outputs a visible image sensed by the visible image sensor portion of the second pixel; and
the pixel pair further comprising a floating diffusion that is shared by the microbolometer sensor portion, the visible image sensor portion of the first pixel, and the visible image sensor portion of the second pixel, the microbolometer sensor portion, the visible image sensor portion of the first pixel, and the visible image sensor portion of the second pixel being controlled to selectively output the signal corresponding to the IR image, the signal corresponding to the visible image sensed by the visible image sensor portion of the first pixel, or the signal corresponding to the visible image sensed by the visible image sensor portion of the second pixel to the floating diffusion, and an output path that is shared by the microbolometer sensor portion, the visible image sensor portion of the first pixel, and the visible image sensor portion of the second pixel.

11. The image sensor of claim 10, further comprising an output path that is shared by four visible image sensor portions and the microbolometer sensor portion.

12. The image sensor of claim 10, further comprising an output path that is shared by eight visible image sensor portions and the microbolometer sensor portion.

13. A pixel for an image sensor, comprising:
a first microbolometer sensor portion that outputs a first signal corresponding to an infrared (IR) image sensed by the first microbolometer sensor portion, the first microbolometer sensor portion comprising a capacitive microbolometer sensor;
a first visible image sensor portion that outputs a second signal corresponding to a visible image sensed by the first visible image sensor portion, the first visible image sensor portion comprising a photodiode; and a first floating diffusion that is shared by the first microbolometer sensor portion and the first visible image sensor portion, the first microbolometer sensor portion and the first visible image sensor portion being controlled to selectively output the first signal or the second signal to the first floating diffusion, the pixel comprising one pixel of an array of pixels, and the array of pixels comprising a second pixel comprising:

a second microbolometer sensor portion that outputs a third signal corresponding to an IR image sensed by the second microbolometer sensor portion;

a second visible image sensor portion that outputs a fourth signal corresponding to a visible image sensed by the second visible image sensor portion; and a second floating diffusion that is shared by the second microbolometer sensor portion and the second visible image sensor portion, the second floating diffusion being controlled to selectively output the third signal or the fourth signal to the second floating diffusion.

14. The pixel of claim 13, further comprising an output path that is shared with a second pixel.

* * * * *